(12) United States Patent
Shimada et al.

(10) Patent No.: US 7,998,914 B2
(45) Date of Patent: Aug. 16, 2011

(54) CLEANING SOLUTION FOR SEMICONDUCTOR DEVICE OR DISPLAY DEVICE, AND CLEANING METHOD

(75) Inventors: Kenji Shimada, Tokyo (JP); Kojiro Abe, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 46 days.

(21) Appl. No.: 12/095,344

(22) PCT Filed: Nov. 24, 2006

(86) PCT No.: PCT/JP2006/323408
§ 371 (c)(1),
(2), (4) Date: Sep. 24, 2009

(87) PCT Pub. No.: WO2007/063767
PCT Pub. Date: Jun. 7, 2007

(65) Prior Publication Data
US 2010/0152085 A1   Jun. 17, 2010

(30) Foreign Application Priority Data
Dec. 1, 2005 (JP) ................................. 2005-348106

(51) Int. Cl.
*H01L 21/02* (2006.01)
*C11D 7/32* (2006.01)

(52) U.S. Cl. ........................... 510/175; 510/176; 134/2

(58) Field of Classification Search .................. 510/175, 510/176; 134/2
See application file for complete search history.

(56) References Cited

U.S. PATENT DOCUMENTS

| | | | |
|---|---|---|---|
| 6,068,000 A * | 5/2000 | Tanabe et al. .................. 134/1.3 |
| 6,896,744 B2 * | 5/2005 | Morinaga et al. ............... 134/28 |
| 7,572,758 B2 * | 8/2009 | Shimada et al. ............. 510/175 |
| 2003/0181344 A1 | 9/2003 | Ikemoto et al. |
| 2004/0099290 A1 * | 5/2004 | Morinaga et al. ............... 134/27 |
| 2004/0256358 A1 | 12/2004 | Shimizu et al. |
| 2005/0176604 A1 * | 8/2005 | Lee et al. ...................... 510/175 |
| 2005/0287480 A1 | 12/2005 | Takashima |
| 2006/0040838 A1 * | 2/2006 | Shimada et al. ............. 510/175 |
| 2010/0197136 A1 * | 8/2010 | Shimada et al. ............. 438/653 |

FOREIGN PATENT DOCUMENTS

| | | |
|---|---|---|
| EP | 0 232 092 | 8/1987 |
| EP | 0 662 705 A2 | 7/1995 |
| EP | 0 901 160 A2 | 3/1999 |
| EP | 1 031 884 | 8/2000 |
| EP | 1 091 254 | 4/2001 |
| EP | 1 211 563 | 6/2002 |
| EP | 1 400 858 | 3/2004 |
| JP | 62-049355 | 3/1987 |
| JP | 64-042653 | 2/1989 |
| JP | 07-201794 | 8/1995 |
| JP | 11-067632 | 3/1999 |
| JP | 2003-016730 | 1/2003 |
| JP | 2003-292993 | 10/2003 |
| JP | 2005-292288 | 10/2005 |
| WO | WO 03/038529 | 5/2003 |

OTHER PUBLICATIONS

Extended European Search Report, including Supplementary European Search Report and European Search Opinion, dated Dec. 28, 2009, for Application No. EP 06 83 3212.
European Official Action dated Jan. 27, 2011, for EP Application No. 06 833 212.1-1226.

* cited by examiner

*Primary Examiner* — Gregory E Webb
(74) *Attorney, Agent, or Firm* — Antonelli, Terry, Stout & Kraus, LLP.

(57) ABSTRACT

A cleaning solution for semiconductor devices or display devices containing a polyamine of a specified structure having two or more amino groups in adjacent positions of a carbon chain or a salt thereof and a cleaning method of semiconductor devices or display devices using the subject cleaning solution are provided. The cleaning solution for semiconductor devices or display devices of the present invention has high safety, brings a little burden on the environment and is able to easily remove etching residues on a semiconductor substrate in a short time; on that occasion, it is possible to achieve microfabrication without utterly corroding wiring materials; and furthermore, rinsing can be achieved with only water without necessity for use of, as a rinse solution, an organic solvent such as alcohols. In consequence, according to the cleaning method of the present invention, in manufacturing semiconductor devices or display devices, it is possible to extremely advantageously manufacture circuit wirings with a little burden on the environment, high precision and high quality on an industrial scale.

14 Claims, 1 Drawing Sheet

CLEANING SOLUTION FOR SEMICONDUCTOR DEVICE OR DISPLAY DEVICE, AND CLEANING METHOD

TECHNICAL FIELD

The present invention relates to a cleaning solution and a cleaning method both for removing deposits on the surface of a material to be treated in a manufacturing process of semiconductor devices or display devices. In detail, the present invention relates to a cleaning solution and a cleaning method both bringing a little burden on the environment and capable of removing firm deposits on the surface of a material to be treated without damaging a semiconductor base on the material to be treated including metal wirings and interlayer insulating films.

BACKGROUND ART

Nowadays, a lithography method is generally employed as a manufacturing method of semiconductor devices such as highly integrated LSIs. In the case where a semiconductor device is manufactured by this lithography method, in general, after forming an electrically conductive thin film such as metallic films operating as an electrically conductive wiring material or an interlayer insulating film such as a silicon oxide film for the purpose of achieving insulation between wirings on a substrate such as a silicon wafer, a photoresist is uniformly coated on the surface thereof to provide a photosensitive layer, which is then subjected to selective exposure and development treatment to form a desired resist pattern. Subsequently, the thin film in a lower layer part is subjected to a selective etching treatment through this resist pattern as a mask to form a desired resist pattern on the subject thin film. Then, a series of processes for completely removing this resist pattern are taken.

In recent years, in semiconductor devices, high integration is advanced, and the formation of a pattern of not more than 0.18 μm becomes necessary. Following the ultra-microfabrication of this processing size, a dry etching method has become the main current in the foregoing selective etching treatment. In the dry etching treatment, it is known that residues to be caused due to a dry etching gas, a resist, a film to be processed, a treatment member in a dry etching apparatus, etc. (the residues will be hereinafter referred to as "etching residues") are formed in the surroundings of the formed pattern. In particular, when etching residues remain in the inside of a via hole and the surroundings thereof, non-preferable situations including high resistance and the generation of an electric short circuit are brought.

Organic amine based strippers composed of a mixed system of an alkanolamine and an organic solvent are disclosed as a cleaning solution for removing etching residues in a process for forming a metal wiring (see Patent Documents 1 and 2). However, in such a cleaning solution, in the case where after removing the resist and the like as well as etching residues, water washing is performed, the amine is dissociated due to the absorbed moisture to assume alkalinity, and it corrodes a metal film or the like. Therefore, a rinse solution requires an organic solvent such as alcohols, and there is involved a problem that burdens on the safety and environment are large.

Also, fluorine based cleaning solutions composed of a fluorine compound, an organic solvent, an anticorrosive and the like are used as a cleaning agent having higher ability to remove etching residues and a resist cured layer than the organic amine based stripper (see Patent Documents 3 and 4).

However, in recent years, conditions for dry etching in the manufacturing process of semiconductor devices have become severe, and a resist is more likely denatured. Thus, it has become impossible to achieve complete removal with the foregoing fluorine based aqueous solution.

In these organic amine based cleaning solutions or
In these organic amine based cleaning solutions or fluorine based cleaning solutions containing a large amount of an organic solvent, in the semiconductor manufacturing process, burdens on the economy and environment such as safety measures and liquid-waste treatment are large, and excessive measures are needed. For that reason, an acid based cleaning agent which is an aqueous solution of an organic acid and a reducing agent is disclosed as a water-soluble cleaning solution (see Patent Document 5).

However, according to this water-soluble cleaning solution, it is impossible to completely remove firmly denatured etching residues. Also, since the reducing agent is consumed for the reduction of chemical components or components in air, not only the base-before date is short, but special custody is necessary for keeping the quality. Furthermore, since the water-soluble cleaning solution is a strong acid, special attention must be paid for the disposal, and it cannot be said that the burdens on the economy and environment are thoroughly reduced.

For these reasons, a cleaning solution capable of completely removing etching residues without damaging wiring raw materials and bringing little burdens on the safety and environment in the semiconductor manufacturing process is keenly demanded.

Patent Document 1: JP-A-62-49355
Patent Document 2: JP-A-64-42653
Patent Document 3: JP-A-7-201794
Patent Document 4: JP-A-11-67632
Patent Document 5: JP-A-2003-16730

DISCLOSURE OF THE INVENTION

Problems that the Invention is to Solve

An object of the present invention is to provide a cleaning solution which is able to remove etching residues remaining after dry etching in a wiring process of a semiconductor device to be used in a semiconductor integrated circuit or a wiring process of a display device in a short time, does not oxidize or corrode wiring materials, interlayer insulating films or the like and brings a little burden on the environment and a cleaning method using the same.

Means for Solving the Problems

In order to achieve the foregoing object, the present inventors made extensive and intensive investigations. As a result, it has been found that the subject object can be achieved by using a cleaning solution containing a polyamine of a specified structure having two or more amino groups in adjacent positions of a carbon chain or a salt thereof, or a cleaning solution further containing an acidic compound or a basic compound or further a fluorine compound, leading to accomplishment of the present invention.

Specifically, the present invention is to provide the following cleaning solution and cleaning method both for semiconductor devices or display devices.

1. A cleaning solution for semiconductor devices or display devices, comprising a polyamine represented by the following general formula (1) or general formula (2) or a salt thereof.

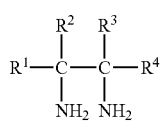

(1)

($R^1$ to $R^4$ each independently represents a hydrogen atom, an alkyl group, an aralkyl group, an alkenyl group, an aryl group, a hydroxyalkyl group, an aminoalkyl group or an alkoxyalkyl group, provided that when $R^1$ and $R^4$ are an alkyl group, they may be bonded to each other to form a ring.)

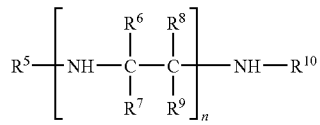

(2)

($R^5$ to $R^{10}$ each independently represents a hydrogen atom, an alkyl group, an aralkyl group, an alkenyl group, an aryl group, a hydroxyalkyl group, an aminoalkyl group or an alkoxyalkyl group; and n represents an integer of from 1 to 5.)

2. The cleaning solution for semiconductor devices or display devices as set forth above in 1, further containing an acidic compound and/or a basic compound.
3. The cleaning solution for semiconductor devices or display devices as set forth above in 1 or 2, further containing a fluorine compound.
4. The cleaning solution for semiconductor devices or display devices as set forth above in 3, wherein the fluorine compound is hydrofluoric acid, ammonium fluoride or tetramethylammonium fluoride.
5. A cleaning method of semiconductor devices or display devices, comprising using the cleaning solution as set forth above in any one of 1 to 4.

Advantages of the Invention

Since the cleaning solution for semiconductor devices or display devices of the present invention does not contain a hazardous material, does not change in quality in air and can be used in a relatively low concentration, the present invention has a characteristic feature that it has high safety and brings a little burden on the environment.

By using the cleaning solution of the present invention, it is possible to easily remove etching residues on a semiconductor substrate in a short time; on that occasion, it is possible to achieve microfabrication without utterly corroding wiring materials; and furthermore, rinsing can be achieved with only water without necessity for use of, as a rinse solution, an organic solvent such as alcohols.

DESCRIPTION OF REFERENCE NUMERALS AND SIGNS

Figure 1:
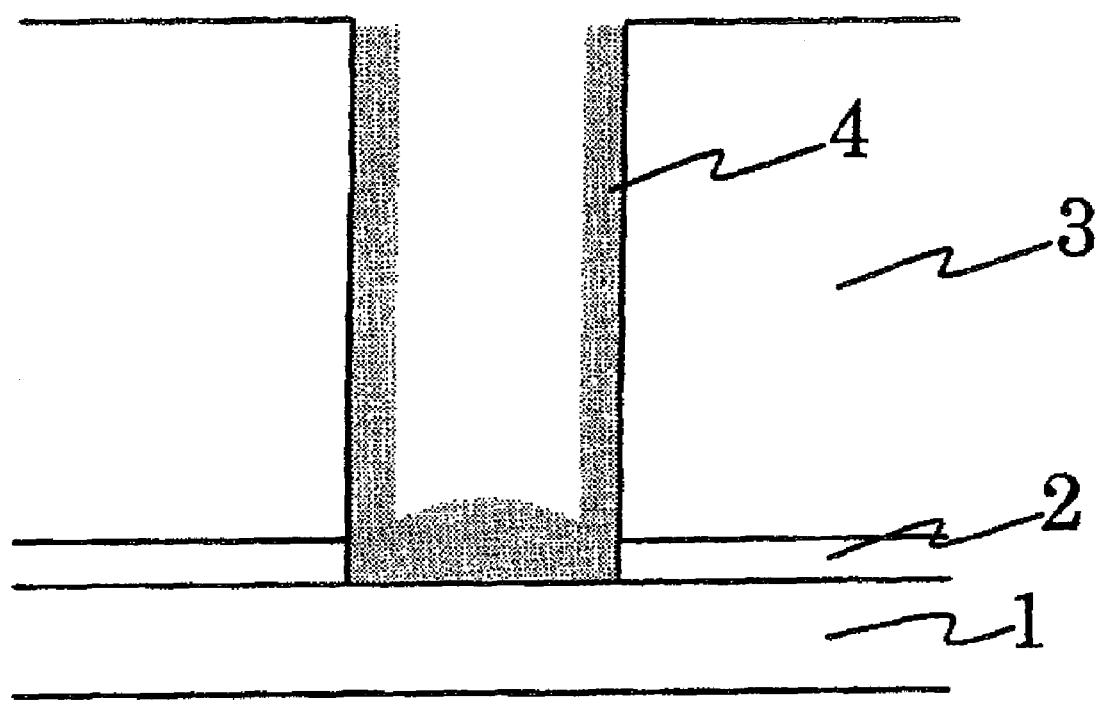
FIG. 1 is a cross-sectional view of a semiconductor device prepared in the Examples by accumulating a silicon nitride film and a silicon oxide film in this order on a lower copper wiring body by a CVD method, coating a resist, processing the resist using a usual photolithography technology, etching processing the silicon oxide film in a desired pattern using a dry etching technology and then removing the remaining resist.

1 Lower copper wiring body
2 Silicon nitride film
3 Silicon oxide film
4 Etching residues

BEST MODES FOR CARRYING OUT THE INVENTION

First of all, the cleaning solution for semiconductor devices or display devices of the present invention (hereinafter also referred to as "cleaning solution") comprises a polyamine represented by the following general formula (1) or general formula (2) or a salt thereof.

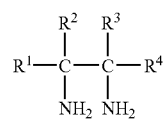

(1)

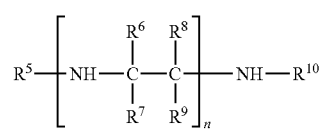

(2)

$R^1$ to $R^4$ in the general formula (1) and $R^5$ to $R^{10}$ in the general formula (2), each independently represents a hydrogen atom, an alkyl group, an aralkyl group, an alkenyl group, an aryl group, a hydroxyalkyl group, an aminoalkyl group or an alkoxyalkyl group. However, when $R^1$ and $R^4$ in the general formula (1) are an alkyl group, they may be bonded to each other to form a ring. Also, n represents an integer of from 1 to 5.

In the general formula (1) and general formula (2), the carbon atom number of the alkyl group is preferably from 1 to 5; the carbon atom number of the aralkyl group is preferably from 7 to 11; the carbon atom number of the alkenyl group is preferably from 2 to 6; and the carbon atom number of the aryl group is preferably from 6 to 10 carbon atoms.

Specific examples of the polyamine represented by the formula (1) include ethylenediamine, 1,2-diaminopropane, 2,3-diaminobutane and 1,2-diaminocyclohexane. Specific examples of the polyamine represented by the formula (2) include diethylenetriamine, triethylenetetramine, tetraethylenepentamine and pentaethylenehexamine. These polyamines may be used singly or in combination of two or more kinds thereof.

In the cleaning solution of the present invention, the concentration of the polyamine represented by the general formula (1) and general formula (2) is usually 0.005% by mass or more, and preferably 0.01% by mass or more. When the concentration is 0.005% by mass or more, etching residues remaining after dry etching and the like can be effectively removed. From the viewpoint of the performance for removing the etching residues, it is not necessary to provide an upper limit thereof. However, taking into consideration safety as well as burdens on the economy and environment, it is necessary to choose an adequate amount. Taking into consideration a burden on the environment, the concentration of water is preferably 80% by mass or more.

In the cleaning solution of the present invention, in addition to the polyamine represented by the foregoing general formula (1) or general formula (2), an acidic compound and a basic compound are preferably used for the purpose of adjusting the pH. The acidic compound and basic compound are each preferably a metal-free compound. Since the polyamine represented by the general formula (1) or general formula (2) has performance for removing etching residues in an arbitrary pH region, it is possible to arbitrarily choose the pH of the cleaning solution for the purposes of corrosiveness of the wiring metal and the interlayer insulating film or prevention of deposition of metal impurities.

As to the acidic compound and basic compound to be used, the types and concentrations are not particularly limited within the range where the object of the present invention is not hindered. All of inorganic acids, organic acids and bases are useful.

Specific examples of inorganic acids include boric acid, hydrochloric acid, nitric acid, nitrous acid, sulfuric acid, sulfurous acid, phosphoric acid, phosphorous acid and hypophosphorous acid.

Specific examples of organic acids include formic acid, acetic acid, propionic acid, butyric acid, isobutyric acid, valeric acid, heptanoic acid, lauric acid, palmitic acid, stearic acid, acrylic acid, methacrylic acid, oxalic acid, malonic acid, maleic acid, succinic acid, adipic acid, citric acid, ascorbic acid, isoascorbic acid, glyoxylic acid, benzoic acid, toluic acid, phthalic acid, trimellitic acid, pyromellitic acid, benzenesulfonic acid, toluenesulfonic acid and salicylic acid.

Specific examples of bases include ammonia, tetramethylammonium hydroxide, trimethylhydroxyethylammonium hydroxide (choline), ethanolamine and hydroxylamine.

The acidic compound and/or the basic compound to be used in the present invention may be used singly or properly in combination of two or more kinds thereof. Also, the concentration of each of the acidic compound and the basic compound is preferably determined while taking into consideration the desired pH.

Even in the case where the cleaning solution of the present invention does not contain a fluorine compound, it has sufficient performance for removing etching residues. However, it is preferable to add a fluorine compound for the purpose of eliminating the etching residues deposited on the interlayer insulating film together with a surface layer of the interlayer insulating film.

Examples of the fluorine compound to be used include hydrofluoric acid, ammonium fluoride, acidic ammonium fluoride and a quaternary ammonium fluoride represented by the following general formula (3).

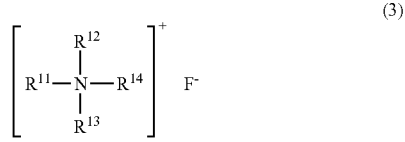

(3)

In the foregoing formula, $R^{11}$ to $R^{14}$ each independently represents a hydrogen atom, an alkyl group, an aralkyl group, an alkenyl group, an aryl group, a hydroxyalkyl group, an aminoalkyl group or an alkoxyalkyl group. In this general formula (3), the carbon atom number of the alkyl group is preferably from 1 to 5; the carbon atom number of the aralkyl group is preferably from 7 to 11; the carbon atom number of the alkenyl group is preferably from 2 to 6; and the carbon atom number of the aryl group is preferably from 6 to 10 carbon atoms.

Specific examples of the quaternary ammonium fluoride represented by the general formula (3) include tetramethylammonium fluoride, tetraethylammonium fluoride, triethylmethylammonium fluoride, trimethylhydroxyethylammonium fluoride, tetraethanolammonium fluoride and methyltriethanolammonium fluoride. Of these, hydrofluoric acid, ammonium fluoride and tetramethylammonium fluoride are preferable.

In the cleaning solution of the present invention, this fluorine compound may be used singly or properly in combination of two or more kinds thereof; and its concentration is preferably from 0.001 to 15% by mass, and more preferably from 0.005 to 10% by mass.

In order to enhance wettability of the cleaning solution, a surfactant may be added, and all of surfactants including cationic, anionic, nonionic and fluorine based surfactants are useful. The surfactant may be used singly or properly in combination of two or more kinds thereof.

In order to further enhance corrosion prevention properties of the cleaning solution against metal wirings, a corrosion preventing agent may be added. The corrosion preventing agent is not particularly limited. Chelate compounds such as phosphoric acid based chelates, carboxylic acid based chelates, amine based chelates, oxime based chelates and acetylene based chelates; aromatic hydroxy compounds; triazole and tetrazole compounds; sugar alcohols; and salts thereof; and the like are useful.

Specific examples of chelate compounds include phosphoric acid based chelate compounds such as 1,2-propanediaminetetramethylenephosphonic acid and hydroxyethanephosphonic acid; carboxylic acid based chelate compounds such as ethylenediaminetetraacetic acid, dihydroxyethyl glycine, nitrilotriacetic acid, oxalic acid, citric acid, malic acid and tartaric acid; amine based chelate compounds such as bipyridine, tetraphenylporphyrin, phenanthroline and 2,3-pyridinediol; oxime based chelate compounds such as dimethylglyoxime, diphenylglyoxime; and acetylene based chelate compounds such as phenylacetylene and 2,5-dimethyl-3-hexyne-2,5-diol.

Specific examples of aromatic hydroxy compounds include phenol, cresol, xylenol, pyrocatechol, t-butylcatechol, resorcinol, hydroquinone, pyrogallol, 1,2,4-benzenetriol, salicyl alcohol, p-hydroxybenzyl alcohol, o-hydroxybenzyl alcohol, p-hydroxyphenethyl alcohol, p-aminophenol, m-aminophenol, diaminophenol, aminoresorcinol, p-hydroxybenzoic acid, o-hydroxybenzoic acid, 2,4-dihydroxybenzoic acid, 2,5-dihydroxybenzoic acid, 3,4-dihydroxybenzoic acid, 3,5-dihydroxybenzoic acid and gallic acid.

Examples of triazole and tetrazole compounds include benzotriazole, aminotriazole and aminotetrazole. Examples of sugar alcohols include sorbitol, xylitol and palatinit.

These corrosion preventing agents can be used singly or in combination of two or more kinds thereof.

In the cleaning solution of the present invention, the concentration of the corrosion preventing agent is preferably from 0.001 to 10% by mass, and more preferably from 0.005 to 5% by mass.

Also, in the cleaning solution of the present invention, other additives which are conventionally used in cleaning solutions may be blended, if desired within the range where the object of the present invention is not hindered.

In the cleaning method of semiconductor devices or display devices using the foregoing cleaning solution of the present invention, the cleaning temperature is usually from ordinary temperature to 70° C. and is properly chosen depending upon the etching condition and semiconductor substrates and wiring metals to be used.

The semiconductor devices and display devices to be used in the cleaning method of the present invention include substrate materials such as silicon, amorphous silicon, polysilicon and glass; insulating materials such as silicon oxide, silicon nitride and derivatives thereof; barrier materials such as titanium nitride, tantalum and tantalum compounds; wiring materials such as copper, tungsten, titanium-tungsten, aluminum, aluminum alloys, chromium and chromium alloys; compound semiconductors such as gallium-arsenic, gallium-phosphorus and indium-phosphorus; and oxide semiconductors such as chromium oxide. By using the cleaning solution of the present invention, it is possible to achieve cleaning to completely remove etching residues and the like without damaging these raw materials.

In the cleaning method of the present invention, ultrasonic waves can be used in combination as the need arises.

As to a rinse solution after removing the etching residues on the semiconductor substrate and the like according to the cleaning method of the present invention, it is not necessary to use an organic solvent such as alcohols, and rinsing with only water is sufficient.

EXAMPLES

The present invention is hereunder specifically described with reference to the Examples and Comparative Examples. However, it should be construed that the present invention is by no means limited to these Examples.

In the following Examples, the evaluation criteria after cleaning a semiconductor device are as follows.

(1) State of Removal of Etching Residues:
A: The etching residues were completely removed.
B: The etching residues were substantially completely removed.
C: A part of the etching residues remained.
D: A major part of the etching residues remained.

(2) State of Corrosion of Copper:
A: Corrosion was not observed at all.
B: Corrosion was not substantially observed.
C: Corrosion in a crater form or pit form was observed.
D: Roughness was observed on the entire surface of the copper layer, and recession of the copper layer was further observed.

(3) State of Corrosion of Interlayer Insulating Film:
A: Corrosion was not observed at all.
B: Corrosion was not substantially observed.
C: Roughness was observed over a via hole side wall.
D: The size of a via hole increased.

Examples 1 to 10 and Comparative Examples 1 to 3

A cross-sectional view of a part of a semiconductor device prepared by accumulating a silicon nitride film 2 and a silicon oxide film 3 in this order on a copper wiring body 1 by a CVD method, coating a resist, processing the resist using a usual photolithography technology, etching processing the silicon oxide film in a desired pattern using a dry etching technology and then removing the remaining resist is shown in FIG. 1. In this copper circuit device, etching residues 4 remain on a via hole side wall.

The copper circuit device as shown in FIG. 1 was cleaned with a cleaning solution as shown in Table 1 under a prescribed condition, rinsed with ultra pure water and then dried by nitrogen blowing. One hour after standing at ordinary temperature, the surface state was observed by a scanning electron microscope (SEM), and removal properties of the etching residues and corrosion of the copper wiring body were evaluated according to the foregoing criteria. The obtained results are shown in Table 1.

In Table 1, PHOSPHANOL which is a surfactant is a trade name of Toho Chemical Industry Co., Ltd.

TABLE 1

|  | Ex. 1 | Ex. 2 | Ex. 3 | Ex. 4 | Ex. 5 | Ex. 6 | Comp. Ex. 1 | Comp. Ex. 2 | Comp. Ex. 3 | Comp. Ex. 4 |
|---|---|---|---|---|---|---|---|---|---|---|
| Composition of cleaning solution (% by mass) |  |  |  |  |  |  |  |  |  |  |
| (Amine) |  |  |  |  |  |  |  |  |  |  |
| Ethylenediamine | 1.0 |  |  |  |  |  |  |  |  |  |
| 1,2-Diaminopropane |  | 0.1 | 0.1 |  |  |  |  |  |  |  |
| 1,2-Diaminocyclohexane |  |  |  | 0.1 |  |  |  |  |  |  |
| Pentaethylenehexamine |  |  |  |  | 1.0 |  |  |  |  |  |
| Triethylenetetramine |  |  |  |  |  | 6.5 |  |  |  |  |
| o-Phenylenediamine |  |  |  |  |  |  |  | 0.15 |  |  |
| Hydroxylamine |  |  |  |  |  |  |  |  | 0.1 |  |
| (Acid or alkali compound) |  |  |  |  |  |  |  |  |  |  |
| Hydrochloric acid |  |  | 0.3 |  |  |  |  |  | 5.0 |  |
| Nitric acid |  |  |  |  | 0.4 |  |  |  |  |  |
| Oxalic acid |  |  |  |  |  | 4.4 |  | 0.01 |  |  |
| Tetramethylammonium hydroxide |  |  |  | 0.09 |  |  |  |  |  | 1.5 |
| (Fluorine compound) |  |  |  |  |  |  |  |  |  |  |
| Tetramethylammonium fluoride |  |  |  |  |  |  | 4.0 |  | 0.13 |  |
| Ammonium fluoride |  |  |  |  |  |  |  |  |  | 0.5 |
| (Surfactant) |  |  |  |  |  |  |  |  |  |  |
| PHOSPHANOL (RS-710) |  | 0.05 |  |  |  |  |  |  |  |  |
| (Corrosion preventing agent: chelate compound) |  |  |  |  |  |  |  |  |  |  |
| Ethylenediaminetetraacetic acid |  |  |  |  |  |  | 0.005 |  |  |  |
| Water concentration (calculated value) | 99.0 | 99.9 | 99.55 | 99.81 | 98.6 | 85.085 | 99.85 | 99.89 | 94.87 | 98.0 |
| pH | 12 | 11 | 1 | 12 | 9 | 8 | 8 | 8 | 1 | 12 |

TABLE 1-continued

|  | Ex. 1 | Ex. 2 | Ex. 3 | Ex. 4 | Ex. 5 | Ex. 6 | Comp. Ex. 1 | Comp. Ex. 2 | Comp. Ex. 3 | Comp. Ex. 4 |
|---|---|---|---|---|---|---|---|---|---|---|
| Cleaning condition |  |  |  |  |  |  |  |  |  |  |
| Temperature (° C.) | 30 | 30 | 30 | 30 | 50 | 30 | 30 | 30 | 30 | 30 |
| Time (min) | 2 | 2 | 2 | 2 | 1 | 2 | 5 | 2 | 2 | 5 |
| Evaluation results |  |  |  |  |  |  |  |  |  |  |
| State of removal of etching residues | A | A | A | A | A | A | D | D | A | D |
| State of corrosion of copper | A | A | A | A | A | A | A | C | B | A |
| State of corrosion of interlayer insulating film | A | A | A | A | A | A | A | A | D | A |

As is clear from Table 1, in Examples 1 to 6 to which the cleaning solution and the cleaning method of the present invention are applied, the cleaning can be achieved without utterly corroding copper and utterly corroding the interlayer insulating film, and excellent removal properties of etching residues are revealed.

INDUSTRIAL APPLICABILITY

The cleaning solution for semiconductor devices or display devices of the present invention has high safety, brings a little burden on the environment and is able to easily remove etching residues on a semiconductor substrate in a short time; on that occasion, it is possible to achieve microfabrication without utterly corroding wiring materials; and furthermore, rinsing can be achieved with only water without necessity for use of, as a rinse solution, an organic solvent such as alcohols.

Accordingly, according to the cleaning method of the present invention, in manufacturing semiconductor devices or display devices, it is possible to extremely advantageously manufacture circuit wirings with a little burden on the environment, high precision and high quality on an industrial scale.

The invention claimed is:

1. A cleaning solution for semiconductor devices or display devices, comprising a polyamine selected from the group consisting of 1,2-diaminopropane, 1,2-diaminocyclohexane, pentaethylenehexamine and triethylenetetramine, and further comprising an acidic compound.

2. The cleaning solution for semiconductor devices or display devices according to claim 1, further containing a basic compound.

3. The cleaning solution for semiconductor devices or display devices according to claim 1, further containing a fluorine compound.

4. The cleaning solution for semiconductor devices or display devices according to claim 3, wherein the fluorine compound is hydrofluoric acid, ammonium fluoride or tetramethylammonium fluoride.

5. A cleaning method of semiconductor devices or display devices, comprising using the cleaning solution according to claim 1.

6. The cleaning solution for semiconductor devices or display devices according to claim 2, further containing a fluorine compound.

7. The cleaning solution for semiconductor devices or display devices according to claim 6, wherein the fluorine compound is hydrofluoric acid, ammonium fluoride or tetramethylammonium fluoride.

8. A cleaning method of semiconductor devices or display devices, comprising using the cleaning solution according to claim 6.

9. A cleaning method of semiconductor devices or display devices, comprising using the cleaning solution according to claim 2.

10. A cleaning method of semiconductor devices or display devices, comprising using the cleaning solution according to claim 3.

11. The cleaning solution for semiconductor devices or display devices according to claim 1, wherein an amount of the polyamine included in the cleaning solution is in a range of 0.1 to 6.5% by mass.

12. The cleaning solution for semiconductor devices or display devices according to claim 3, wherein an amount of the fluorine compound included in the cleaning solution is 4 to 10% by mass.

13. The cleaning solution for semiconductor devices or display devices according to claim 1, wherein said acidic compound is a metal-free compound.

14. The cleaning solution for semiconductor devices or display devices according to claim 2, wherein said basic compound is a metal-free compound.

* * * * *